United States Patent

Steffan

(10) Patent No.: US 7,251,793 B1
(45) Date of Patent: Jul. 31, 2007

(54) PREDICTING DEFECT FUTURE EFFECTS IN INTEGRATED CIRCUIT TECHNOLOGY DEVELOPMENT TO FACILITATE SEMICONDUCTOR WAFER LOT DISPOSITION

(75) Inventor: Paul J. Steffan, Elk Grove, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 362 days.

(21) Appl. No.: 10/770,711

(22) Filed: Feb. 2, 2004

(51) Int. Cl.
*G06F 17/50* (2006.01)
(52) U.S. Cl. .......................................... 716/4
(58) Field of Classification Search ................. 716/4; 700/121
See application file for complete search history.

(56) References Cited

U.S. PATENT DOCUMENTS

| | | | | |
|---|---|---|---|---|
| 3,751,647 A * | 8/1973 | Maeder et al. | ............... | 713/401 |
| 5,991,699 A * | 11/1999 | Kulkarni et al. | ............... | 702/83 |
| 6,028,994 A * | 2/2000 | Peng et al. | .................... | 703/15 |
| 6,449,749 B1 * | 9/2002 | Stine | ............................... | 716/4 |
| 6,507,933 B1 * | 1/2003 | Kirsch et al. | .................. | 716/4 |
| 6,622,059 B1 * | 9/2003 | Toprac et al. | ............... | 700/121 |
| 6,725,121 B1 * | 4/2004 | Pasadyn et al. | ............. | 700/121 |
| 6,901,564 B2 * | 5/2005 | Stine et al. | ..................... | 716/4 |
| 6,912,439 B2 * | 6/2005 | Mouli | ........................ | 700/121 |
| 6,980,873 B2 * | 12/2005 | Shen | .......................... | 700/108 |
| 2002/0165636 A1 * | 11/2002 | Hasan | ........................ | 700/121 |
| 2004/0225396 A1 * | 11/2004 | Maeritz | ...................... | 700/109 |
| 2005/0049737 A1 * | 3/2005 | Lin et al. | ..................... | 700/110 |

* cited by examiner

*Primary Examiner*—Stacy A. Whitmore
*Assistant Examiner*—Magid Y. Dimyan
(74) *Attorney, Agent, or Firm*—Mikio Ishimaru

(57) ABSTRACT

A method for facilitating semiconductor wafer lot disposition includes providing detailed descriptive information of the semiconductor wafer layout and generating data concerning at least one defect in the semiconductor wafers at an intermediate processing stage. At least one layer model is generated from the information and data to disclose the effects of the defect upon at least one later layer of the semiconductor wafers. The layer model is utilized to determine the subsequent disposition of the wafer lot.

20 Claims, 3 Drawing Sheets

PREDICTING DEFECT FUTURE EFFECTS IN INTEGRATED CIRCUIT TECHNOLOGY DEVELOPMENT TO FACILITATE SEMICONDUCTOR WAFER LOT DISPOSITION

BACKGROUND

1. Technical Field

The present invention relates generally to semiconductor technology and more specifically to semiconductor research and development.

2. Background Art

At the present time, electronic products are used in almost every aspect of life, and the heart of these electronic products is the integrated circuit. Integrated circuits are used in a wide variety of products, such as televisions, telephones, and appliances.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems. For example, semiconductor wafers are manufactured in large groups, or lots. At various stages in the manufacturing or fabrication process, decisions must be made about the quality and condition of each lot, in order to determine the subsequent dispositions of the lots.

Unfortunately, engineers in charge of the manufacturing processes must make those decisions with only limited information. For example, defects are often found on wafer lots in early processing stages. It is then necessary to make a determination concerning whether or not those defects will cause problems in subsequent processing, and if so, the nature and importance of those problems. Considering the enormous complexity of the circuit features on semiconductor wafers, the information that is available to the process engineers is typically far too little for such sophisticated determinations. As a consequence, those decisions can end up appearing somewhat like educated guesswork.

What is needed is an analytical tool that can show the process engineers the actual effects of the various defects at subsequent stages of the wafer fabrication process.

Solutions to these problems have been long sought but prior developments have not taught or suggested any solutions and, thus, solutions to these problems have long eluded those skilled in the art.

DISCLOSURE OF THE INVENTION

The present invention provides a method for facilitating semiconductor wafer lot disposition. Detailed descriptive information of the semiconductor wafer layout is provided, and data concerning at least one defect in the semiconductor wafers is generated at an intermediate processing stage. At least one layer model is then generated from the information and data to disclose the effects of the defect upon at least one later layer of the semiconductor wafers. The layer model is then utilized to determine the subsequent disposition of the wafer lot.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
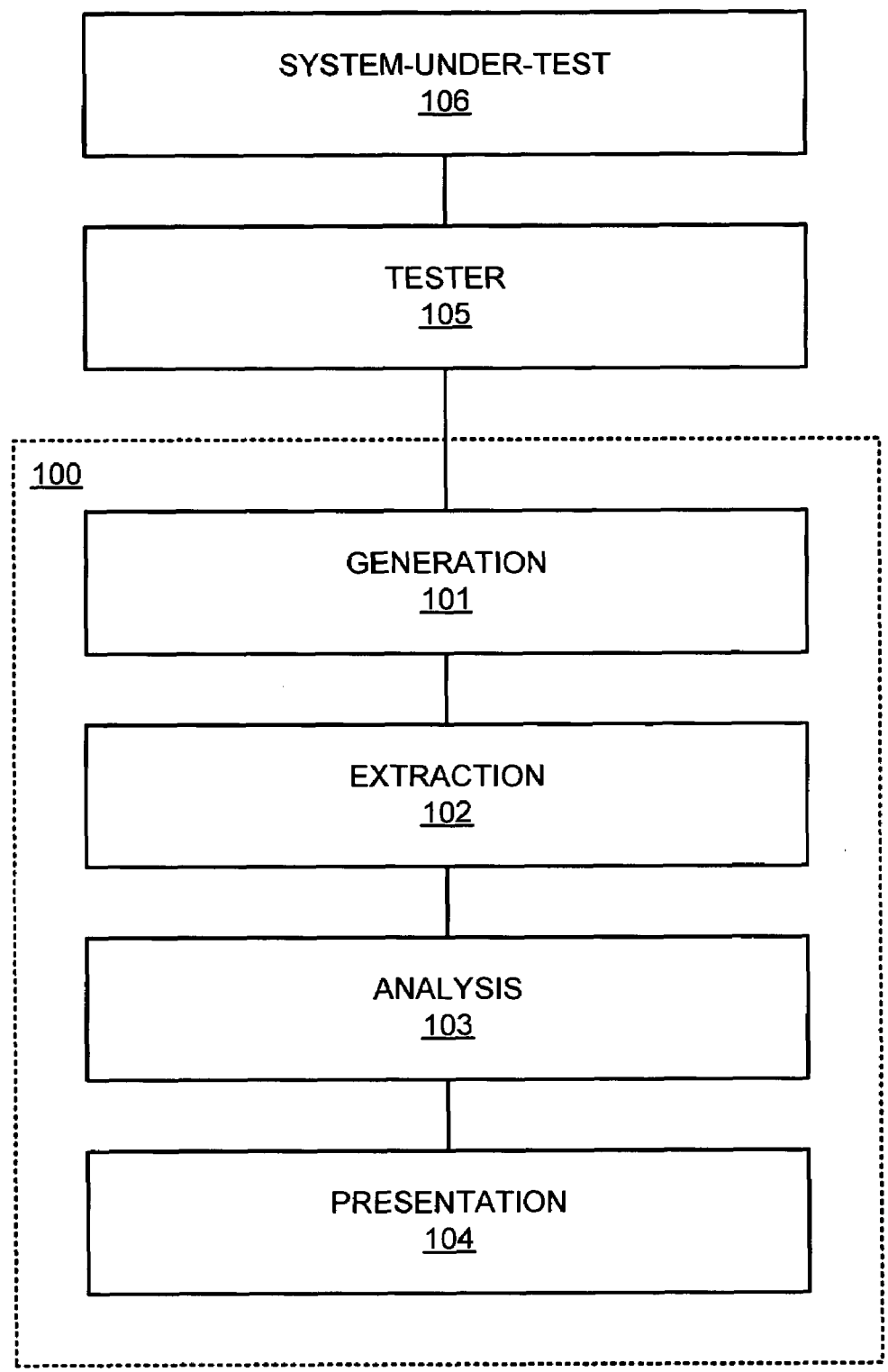
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, conventional test information, a personal computer, etc. It may also require new equipment and/or methods, which are described herein when required.

In the extraction block 102, usable information is extracted from the generated information from the generation block 101. Essentially, the generated information is translated into more useful forms; e.g., broken apart so it can be reassembled in different forms to show different interrelationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points were determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

There is a constant drive within the semiconductor industry to increase the operating speeds and capabilities of integrated circuit devices (microprocessors, memory devices, and the like). This drive is fueled by consumer demands for computers and electronic devices that do more and more at faster and faster speeds. One result has been a continual reduction in the size of semiconductor devices, particularly the transistors on which semiconductor devices are largely based.

Many components of a typical field effect transistor ("FET"), for example, the channel length, junction depth, gate insulation thickness, and the like, have been significantly reduced in size. This enables more functionality to be delivered in less space, and, all other things being equal, at a faster speed. That is, the smaller the channel length of a transistor, the faster the transistor can operate. Thus, there is a constant drive to reduce the size or scale of the components of a typical transistor to increase the overall transistor speed, and hence, the overall speed of the integrated circuit devices that incorporate the transistors.

A transistor is typically formed above a surface of a semiconducting substrate or wafer comprised of doped-silicon. The substrate may be doped with either N-type or P-type dopant materials. The transistor may have a doped polycrystalline silicon ("polysilicon") gate electrode formed above a gate insulation layer. The gate electrode and the gate insulation layer may be separated from doped source/drain ("S/D") regions of the transistor by a dielectric sidewall spacer. The S/D regions for the transistor may be formed by performing one or more ion implantation processes to introduce dopant atoms into the substrate. The dopants may be, for example, arsenic or phosphorous for negative-channel metal-oxide semiconductor ("NMOS") devices, or boron for positive-channel metal-oxide semiconductor ("PMOS") devices.

Shallow trench isolation regions may be provided to isolate the transistor electrically from neighboring semiconductor devices such as other transistors. Additionally, a typical integrated circuit device is comprised of a plurality of conductive interconnections, such as conductive lines and conductive contacts or vias, positioned in multiple layers of insulating material formed layer by layer above the substrate. These conductive interconnections allow electrical signals to propagate between and among the transistors formed above the doped semiconducting substrate. In the fabrication process for forming integrated circuit devices, millions of such transistors are formed above such a semiconducting substrate.

During the course of fabricating the integrated circuit devices, a variety of features, e.g., gate electrodes, conductive lines, openings in layers of insulating material, conductors filled into those openings, and so forth, are formed to very precisely controlled dimensions. It is very important in modern semiconductor processing that the features be formed as accurately as possible due to the reduced size of those features. Even slight variations in the actual dimensions of a feature may adversely affect device performance.

In general, semiconductor manufacturing process operations thus involve, among other things, the formation of various such layers, e.g., polysilicon, insulating materials, metals, etc., and the selective removal of portions of those layers by photolithographic, etching, chemical-mechanical planarization, and other known techniques, followed by the formation of additional layers. These processes, along with various ion implantation and heating processes, are continued until all the layers of the integrated circuit devices are completed on the wafer.

During fabrication, the individual completed devices are grouped together to form a "die" (or "chip"), which is a collection of such semiconductor devices that together constitute an entire integrated circuit as a single unit. The dies define the area of the wafer where production integrated circuit devices, e.g., microprocessors, application specific integrated circuits ("ASIC's"), memory devices, and so forth, are formed. Many such dies, which are separated by scribe lines, are fabricated simultaneously on each wafer. The sizes, shapes and numbers of dies per wafer depend upon the types of devices under construction. Typically, several hundred or more dies may be formed on a wafer. Eventually, after all processing operations are completed, the wafer is cut along the scribe lines to individuate each of the dies. The dies are then packaged individually and sold, or incorporated into other circuits.

In modern semiconductor manufacturing, enormous care is taken in fabricating the various integrated circuit devices. Purchasers often provide very detailed product specifications, and meticulousness measures are taken to assure that these requirements are met. However, even with the most sophisticated techniques, defects or imperfections still occur to some degree. Obviously, such problems need to be identified as early and quickly as possible in the semiconductor device manufacturing process. Further, after defects have been identified in a production lot of wafers that has reached a particular manufacturing stage, it is very important to determine whether and how to proceed with further processing so as to maximize yield and minimize cost. To do so requires accurately predicting the significance and future consequences of the defects that have been identified.

Figure 2:
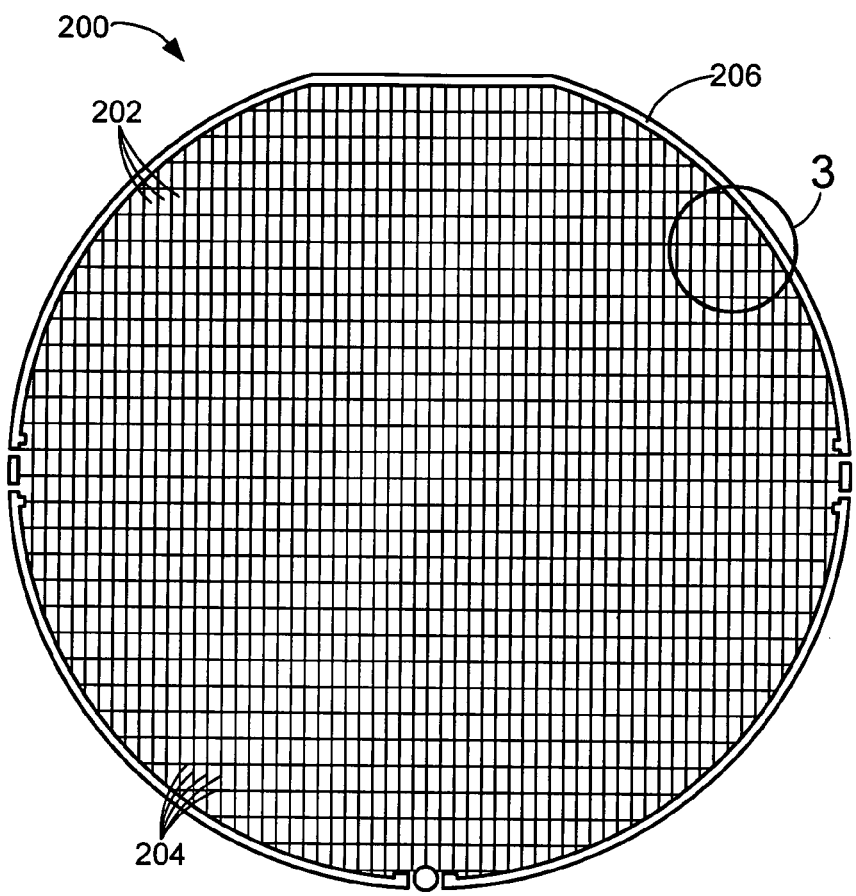
FIG. 2 illustrates a wafer in an intermediate stage of manufacturing.

For example, and referring now to FIG. 2, therein is shown a wafer 200 in an intermediate stage of manufacturing. Large numbers of partially completed dies 202, each having identical functional circuit patterns thereon, are located on the surface of the wafer 200. In the embodiment shown in FIG. 2, each of the partially completed dies 202 is slightly separated from its neighboring dies by conventional scribe lines 204 to provide for individually separating the dies from the wafer 200 upon completion of the wafer manufacturing process. The edge of the wafer 200 along the periphery thereof is defined by a wafer edge area 206.

Figure 3:
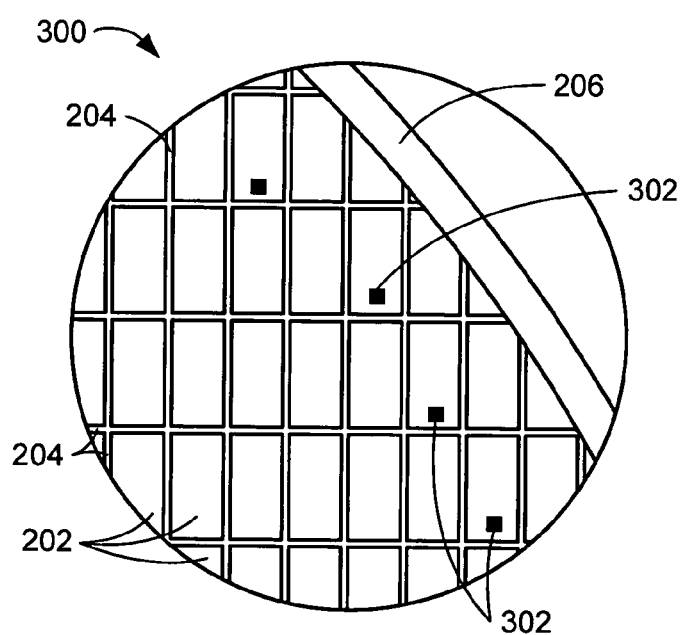
FIG. 3 is an enlarged view of a portion of the wafer shown in FIG. 2.

Referring now to FIG. 3, therein is shown an enlarged view of a wafer portion 300 at and near the periphery of the wafer 200, as indicated generally by circle 3 in FIG. 2. Defects 302 are located in some of the partially completed dies 202. The defects 302 need to be analyzed and their consequences understood for determining further processing of the wafer 200 (FIG. 2).

It has been discovered, according to the teachings of the present invention, that an analytical tool can be provided that shows in detail the actual future effects of current defects, such as the defects 302 (FIG. 3), at subsequent stages of the wafer fabrication process. These effects can now be predicted accurately layer by layer. Thus, the present invention can disclose, for instance, whether the defect at one layer would be likely to cause bridging at a subsequent layer, or cause on open circuit, or cause blockage at a later layer, or cause blockage between various layers, and so forth.

In the present invention, an exact electronic description of the wafer layout for every layer in a wafer's fabrication process is developed. This may be accomplished in a number of different ways. In one embodiment, a computer aided design ("CAD") data file is generated where detailed wafer layout descriptive data is stored and made available for access in the analysis block 103 (FIG. 1). In other embodiments, other exact electronic descriptions of the wafer layout for every layer in a wafer's fabrication process may be used, which are conventionally used in modern semiconductor manufacturing processes.

In the present invention, defect data and information is generated and extracted in the generation block 101 and the extraction block 102. This may be accomplished in a number of different ways. In one embodiment, available semiconductor manufacturing analytical tools are employed in the tester 105 to locate and define the defects 302 (FIG. 3) in the wafer 200 (FIG. 2), which in this case is the system-under-test 106 (FIG. 1). Defect scanning tools can be employed in such an embodiment to determine defect locations in a wafer to within a micron or less. In another embodiment, pattern recognition tools can be used to determine defect locations even more accurately. In still other embodiments, defect volumes can be discovered using such methods as laser confocal imaging. The defect data and information is then generated and extracted according to the present invention in the generation block 101 and the extraction block 102.

As taught by the present invention, data about previous and current layers is then used to build models of one semiconductor layer upon another. This may be accomplished in a number of different ways. In one embodiment, available semiconductor manufacturing 3-D modeling techniques are employed to build the models. In another embodiment, other suitable modeling techniques may be used as appropriate to the particular layer structures at hand. The data for generating such layer models of the semiconductor wafers under analysis is stored in the analysis block 103. As taught herein, such modeling techniques are thus utilized, for example, in the presentation block 104, using the data stored in the analysis block 103.

These techniques, according to the present invention, are used to build up layer information and models above and/or around a defect to see the effects of the defect upon later layers of the semiconductor device. This is done before these later layers are fabricated, making it possible to determine very precisely what the effects of the defect will be before the later layers are manufactured.

The present invention thus provides a much more accurate and robust analytical tool for showing process engineers, before later stages of the semiconductor wafer are actually fabricated, the specific effects that various defects will have at and upon subsequent stages of the wafer fabrication process. As a result, much better and more cost effective process decisions can be made from this far more accurate predictive information.

In greater detail, a method according to the present invention processes defect information of a wafer lot to show future effects of current defects at subsequent stages of a wafer fabrication process. The method thereby facilitates wafer lot dispositions and is performed as follows:

1. Exact, detailed descriptive information of the wafer layout is made available in the analysis block 103.

2. Data and information from the tester 105 concerning defects in the wafers at an intermediate processing stage (the system-under-test 106) is generated, extracted, and made available in the generation block 101 and the extraction block 102.

3. Layer model(s) are generated in the presentation block 104 using information in the generation block 101, the extraction block 102, and the analysis block 103. The layer models disclose the future effects of the current defects upon later layers at subsequent stages of the semiconductor device wafer fabrication process.

4. The layer model(s) are then utilized for improving determinations of the subsequent disposition of the wafer lots being processed.

In another embodiment, information is generated to disclose the components that will subsequently be located above the current defect that is being analyzed. This significantly aids and improves process decisions concerning the disposition of the wafer lots in question.

In yet another embodiment, the defect data and information for the layer with defects, stored in the generation block 101 and the extraction block 102, is treated as a new layer of information. The semiconductor modeling that is performed in the presentation block 104 then incorporates and utilizes this new layer to generate even more accurate layer predictions for the configurations to be expected of later (higher) layers during subsequent process manufacturing.

Figure 4:
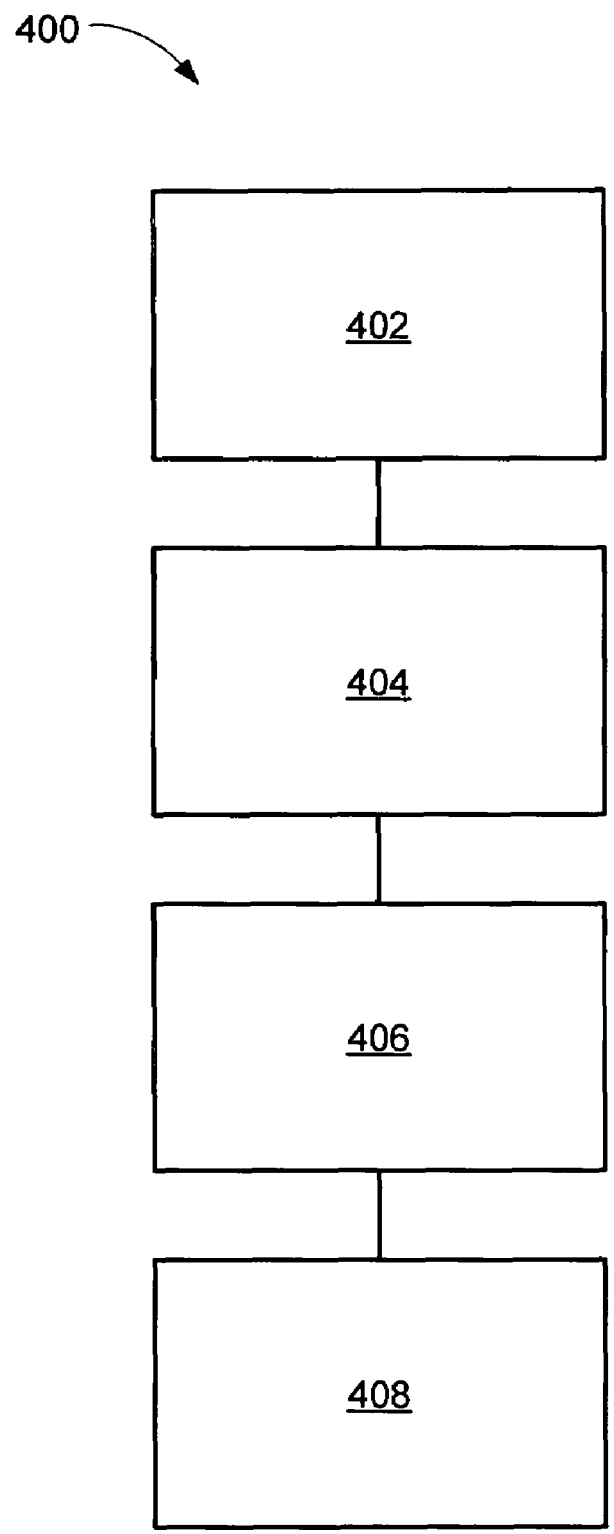
FIG. 4 is a flow chart of a method for facilitating semiconductor wafer lot disposition in accordance with the present invention.

Referring now to FIG. 4, therein is shown a flow chart of a method 400 for facilitating semiconductor wafer lot disposition in accordance with the present invention. The method 400 includes providing detailed descriptive information of the semiconductor wafer layout in a block 402; generating data concerning at least one defect in the semiconductor wafers at an intermediate processing stage in a block 404; generating at least one layer model from the information and data to disclose the effects of the defect upon at least one later layer of the semiconductor wafers in a block 406; and utilizing the layer model to determine the subsequent disposition of the wafer lot in a block 408.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method for facilitating semiconductor wafer lot disposition, comprising:
   providing detailed descriptive information of the semiconductor wafer layout;
   locating and defining current defects in partially completed dies of a semiconductor wafer in a wafer production lot to generate data concerning at least one defect in the semiconductor wafer at an intermediate processing stage;
   generating at least one layer model from the information and data to disclose the effects of the at least one defect upon at least one later layer of the semiconductor wafer; and
   utilizing the at least one layer model to determine the subsequent disposition of the wafer production lot, including whether to proceed with further processing of the wafer production lot.

2. The method of claim 1 wherein generating the at least one layer model further comprises disclosing the components that will be located above the at least one defect in the semiconductor wafers.

3. The method of claim 1 wherein utilizing the at least one layer model to determine the subsequent disposition of the wafer production lot further comprises treating the data concerning the at least one defect as a new layer of information.

4. The method of claim 1 wherein utilizing the at least one layer model to determine the subsequent disposition of the wafer production lot further comprises determining whether the at least one defect would be likely to cause at least one of: bridging at a subsequent layer, an open circuit, blockage at a later layer, and blockage between layers.

5. The method of claim 1 wherein providing detailed descriptive information of the semiconductor wafer layout further comprises providing an electronic description of the semiconductor wafer layout for substantially every layer in the semiconductor wafers' fabrication process.

6. A method for facilitating semiconductor wafer lot disposition, comprising:
   providing detailed descriptive information of the semiconductor wafer layout;
   locating and defining current defects in partially completed dies of semiconductor wafers in a wafer production lot to generate and extract data concerning defects in the semiconductor wafers at an intermediate processing stage;
   generating at least one layer model from the information and data to disclose the future effects of the current defects upon later layers at subsequent stages of the semiconductor wafers' fabrication process; and
   utilizing the at least one layer model to determine the subsequent disposition of the wafer production lot, including whether to proceed with further processing of the wafer production lot.

7. The method of claim 6 wherein generating the at least one layer model further comprises disclosing the components that will be located above the defects in the semiconductor wafers.

8. The method of claim 6 wherein utilizing the at least one layer model to determine the subsequent disposition of the wafer production lot further comprises treating the data concerning the future defects as a new layer of information.

9. The method of claim 6 wherein utilizing the at least one layer model to determine the subsequent disposition of the wafer production lot further comprises determining whether the current defects would be likely to cause at least one of: bridging at a subsequent layer, an open circuit, blockage at a later layer, and blockage between various layers.

10. The method of claim 6 wherein providing detailed descriptive information of the semiconductor wafer layout further comprises providing an electronic description of the semiconductor wafer layout for substantially every layer in the semiconductor wafers' fabrication process.

11. A system for facilitating semiconductor wafer lot disposition, comprising:
    means for providing detailed descriptive information of the semiconductor wafer layout;
    means for locating and defining current defects in partially completed dies of a semiconductor wafer in a wafer production lot to generate data concerning at least one defect in the semiconductor wafer at an intermediate processing stage;

means for generating at least one layer model from the information and data to disclose the effects of the at least one defect upon at least one later layer of the semiconductor wafer; and means for utilizing the at least one layer model to determine the subsequent disposition of the wafer production lot, including whether to proceed with further processing of the wafer production lot.

12. The system of claim 11 wherein the means for generating the at least one layer model further comprises means for disclosing the components that will be located above the at least one defect in the semiconductor wafers.

13. The system of claim 11 wherein the means for utilizing the at least one layer model to determine the subsequent disposition of the wafer production lot further comprises means for treating the data concerning the at least one defect as a new layer of information.

14. The system of claim 11 wherein the means for utilizing the at least one layer model to determine the subsequent disposition of the wafer production lot further comprises means for determining whether the at least one defect would be likely to cause at least one of: bridging at a subsequent layer, an open circuit, blockage at a later layer, and blockage between layers.

15. The system of claim 11 wherein the means for providing detailed descriptive information of the semiconductor wafer layout further comprises means for providing an electronic description of the semiconductor wafer layout for substantially every layer in the semiconductor wafers' fabrication process.

16. A system for facilitating semiconductor wafer lot disposition, comprising:

means for providing detailed descriptive information of the semiconductor wafer layout;

means for locating and defining current defects in partially completed dies of semiconductor wafers in a wafer production lot to generate and extract data concerning defects in the semiconductor wafers at an intermediate processing stage;

means for generating at least one layer model from the information and data to disclose the future effects of the current defects upon later layers at subsequent stages of the semiconductor wafers' fabrication process; and means for utilizing the at least one layer model to determine the subsequent disposition of the wafer production lot, including whether to proceed with further processing of the wafer production lot.

17. The system of claim 16 wherein the means for generating at least one layer model further comprises means for disclosing the components that will be located above the current defects in the semiconductor wafers.

18. The system of claim 16 wherein the means for utilizing the at least one layer model to determine the subsequent disposition of the wafer production lot further comprises means for treating the data concerning the defects as a new layer of information.

19. The system of claim 16 wherein the means for utilizing the at least one layer model to determine the subsequent disposition of the wafer production lot further comprises means for determining whether the current defects would be likely to cause at least one of: bridging at a subsequent layer, an open circuit, blockage at a later layer, and blockage between various layers.

20. The system of claim 16 wherein the means for providing detailed descriptive information of the semiconductor wafer layout further comprises means for providing an electronic description of the semiconductor wafer layout for substantially every layer in the semiconductor wafers' fabrication process.

* * * * *